(12) United States Patent
Meisser et al.

(10) Patent No.: US 6,494,118 B2
(45) Date of Patent: Dec. 17, 2002

(54) METHOD AND EQUIPMENT FOR REMOVING INSULATION FROM A FLAT CABLE

(75) Inventors: Claudio Meisser, Cham (CH); Alois Lustenberger, Littau (CH)

(73) Assignee: Komax Holding AG, Dierikon (CH)

( * ) Notice: Subject to any disclaimer, the term of this patent is extended or adjusted under 35 U.S.C. 154(b) by 0 days.

(21) Appl. No.: 09/947,879

(22) Filed: Sep. 6, 2001

(65) Prior Publication Data

US 2002/0005091 A1 Jan. 17, 2002

Related U.S. Application Data

(62) Division of application No. 09/778,283, filed on Feb. 7, 2001.

(30) Foreign Application Priority Data

Feb. 11, 2000 (EP) .............................................. 00810121

(51) Int. Cl.7 ................................................ H02G 1/12
(52) U.S. Cl. ...................................... 81/9.51; 29/564.4
(58) Field of Search ................... 81/9.4, 9.51; 29/564.4

(56) References Cited

U.S. PATENT DOCUMENTS

| | | | |
|---|---|---|---|
| 3,385,140 A | | 5/1968 | Carpenter et al. |
| 4,439,631 A | * | 3/1984 | Shields ........................ 81/9.51 |
| 4,442,587 A | * | 4/1984 | Shields et al. ................ 81/9.51 |
| 4,455,745 A | * | 6/1984 | Toeppen ...................... 81/9.51 |
| 4,597,176 A | | 7/1986 | Shields et al. |
| 4,667,381 A | * | 5/1987 | Tattanelli et al. .......... 29/564.4 |
| 4,999,910 A | | 3/1991 | Cross |

* cited by examiner

*Primary Examiner*—Eileen P. Morgan
*Assistant Examiner*—Joni B. Danganan
(74) *Attorney, Agent, or Firm*—Cohen, Pontani, Lieberman & Pavane (57) ABSTRACT

Insulation removal equipment for exposing conductors of a flat cable, having a vacuum table, a table drive, a milling tool drive and an advancing drive which is arranged on a carriage and which moves the milling tool drive together with the milling tool on the carriage. The carriage is guided by guide rails arranged at a housing table. The housing table is carried by a housing, at which the table drive is also arranged. The advancing drive moves via a pinion along a rack arranged at the housing and executes the movement of the carriage. The height-adjustable vacuum table is controlled in dependence on the advancing drive and in dependence on the direction of a conductor to be exposed.

6 Claims, 9 Drawing Sheets

METHOD AND EQUIPMENT FOR REMOVING INSULATION FROM A FLAT CABLE

This application is a divisional of parent application Ser. No. 09/778,283 filed on Feb. 7, 2001.

BACKGROUND OF THE INVENTION

1. Field of the Invention

The invention relates to a method and equipment for removing insulation from a flat cable with conductors embedded in insulation and extending parallelly in a longitudinal direction, wherein the insulation is mechanically removed transversely to the longitudinal direction as far as the conductors.

2. Description of the Related Art

Equipment by means of which flat cables can be stripped of insulation has become known from the U.S. Pat. No. 4,597,176. The insulation of the flat cable, which is provided with several conductors, is removed transversely to the longitudinal axis of the cable and at both sides by means of grinding devices. A carriage movable on guides carries a drive motor for the grinding devices arranged at a fork-shaped arm, wherein one grinding device is provided at the upper fork end and one grinding device at the lower fork end. The arm is moved manually so that the flat cable is covered in the transverse direction of the arm. In that case the grinding devices at the upper side and the lower side of the flat cable remove the insulation as far as the conductors.

A disadvantage of the known equipment is that due to tolerances in the insulation thickness the insulation must be removed in sufficient depth so that the conductors are in every case exposed over the whole area. If, because of tolerances, the conductors are disposed higher or are covered with less insulation, they are damaged on one side by the grinding device and insufficiently exposed on the other side.

SUMMARY OF THE INVENTION

Accordingly, it is an object of the present invention is to provide a remedy for the above-stated problem. Pursuant to this object, and others which will become apparent hereafter, one aspect of the present invention resides in a method of removing insulation from a flat cable with conductors embedded in insulation and extending parallelly in a longitudinal direction. The method comprises the step of mechanically removing the insulation transversely to the longitudinal direction as far as the conductors, and carrying out the insulation removal in dependence on a signal for detection of a conductor. The invention meets the object of avoiding the disadvantages of the known equipment and of proposing a method and equipment by means of which a flat cable can be reliably stripped of insulation. A further aspect of the invention resides in equipment for removing insulation from a flat cable with conductors embedded in insulation and extending parallelly in a longitudinal direction. The equipment includes means for removing the insulation transversely to the longitudinal direction as far as the conductors, and a device for detection of a conductor freed from the insulation, the insulation removal means being controllable in dependence on an exposed conductor.

The advantages achieved by the invention are substantially to be seen in that, notwithstanding deviations in cable construction or insulation due to tolerances, the conductors can be consistently satisfactorily and completely freed of insulation, which is important for the subsequent welding or soldering processes. It is further advantageous that the conductors are not damaged during removal of the insulation. It is also advantageous that individual conductors can be stripped of insulation at any desired location of the flat cable.

This is achieved in that the conductor itself is detected and the removal of insulation is carried out in dependence on a corresponding signal. In the case of an advantageous embodiment the complete removal of insulation is carried out only after the conductor or its position relative to the insulation removal is detected. Advantageously, the detection of the conductor is effected by means of the insulation removing device or milling tool. In that case, the electrical conductivity of the conductor is utilised.

The various features of novelty which characterize the invention are pointed out with particularity in the claims annexed to and forming a part of the disclosure. For a better understanding of the invention, its operating advantages, and specific objects attained by its use, reference should be had to the drawing and descriptive matter in which there are illustrated and described preferred embodiments of the invention.

DETAILED DESCRIPTION OF THE PRESENTLY PREFERRED EMBODIMENTS

Figures 1, 2:
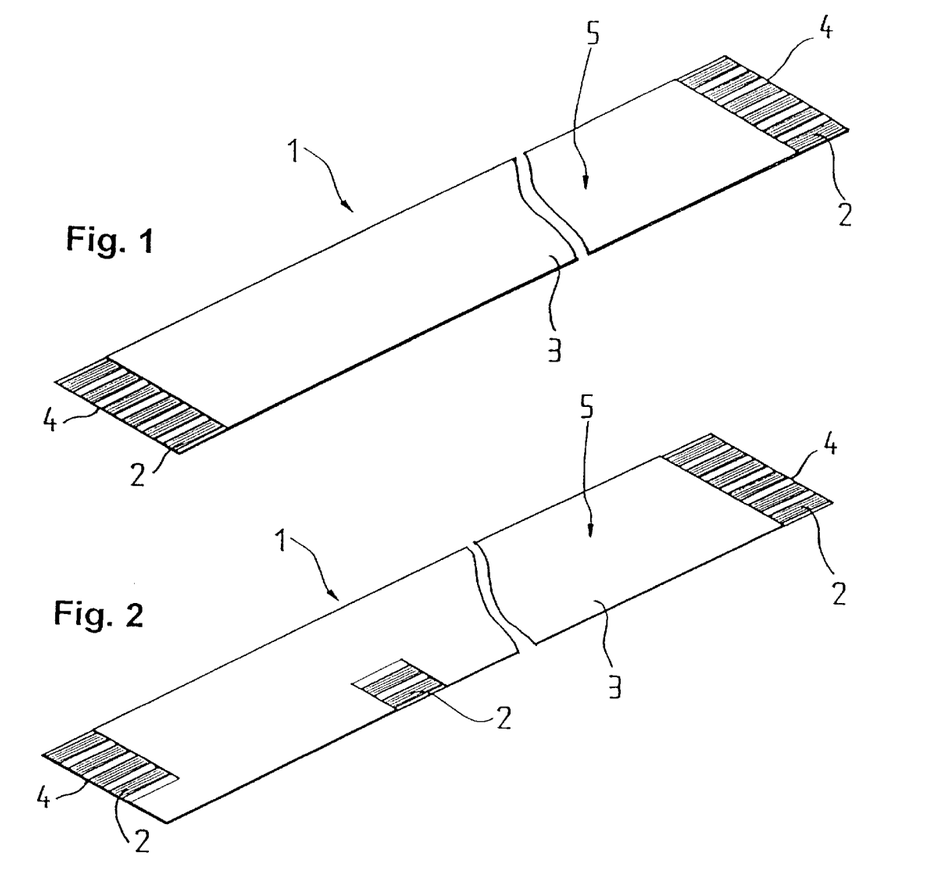
FIG. 1 shows a flat cable with conductors exposed at the cable ends over the entire cable width.
FIG. 2 shows a flat cable with conductors exposed at one cable end and/or at a desired location of the flat conductor.
Figure 3:
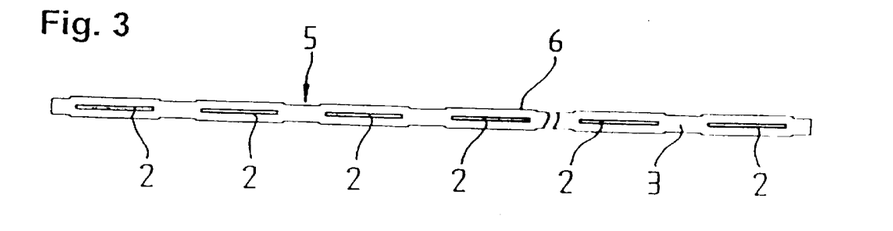
FIG. 3 shows a cross-section of the flat cable.

FIGS. 1 to 3 show a flat cable 1 with flat electrical conductors 2 which extend parallelly in a longitudinal direction and which are embedded in insulation material, called insulation 3 in the following description. FIG. 1 shows the flat cable 1 with conductors 2 exposed at the cable ends 4 over the entire cable width at the upper side 5. FIG. 2 shows the flat cable 1 with a specific number of exposed conductors 2 at one cable end 4 and with a specific number of conductors 2 exposed at a desired place of the flat cable 1. FIG. 3 shows a cross-section of the flat cable 1 with conductors 2 of rectangular cross-section, wherein the insulation 3 has steps 6, which cover the conductors 2, at the surface.

Figure 4:
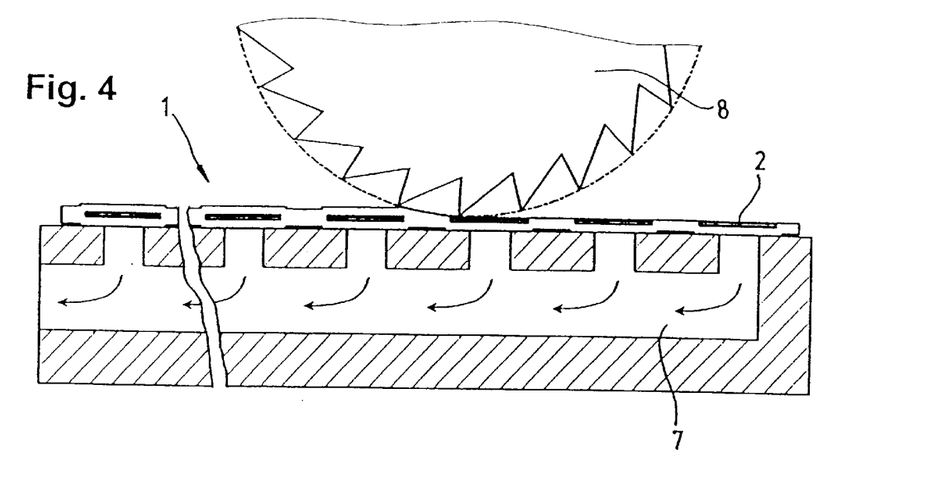
FIG. 4 shows a schematic illustration of the inventive process for removal of the insulation of the flat cable.
Figure 5:
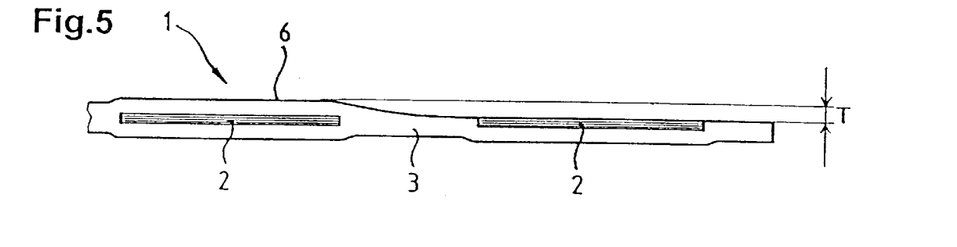
FIG. 5 shows a portion of the flat cable after exposure of a conductor.
Figure 6:
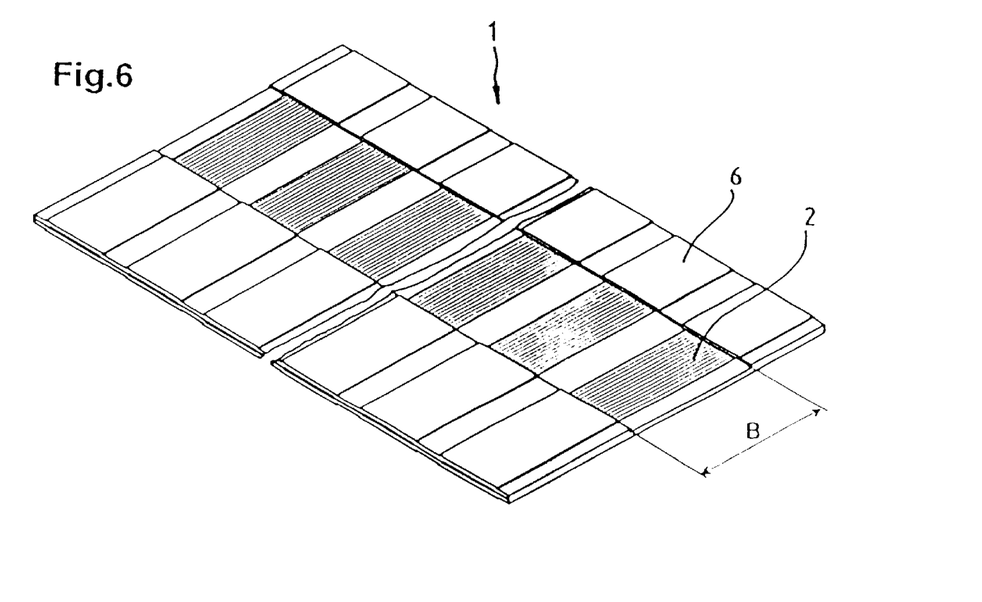
FIG. 6 shows a cable portion after exposure of the conductors of the entire cable width.

FIG. 4 is a schematic illustration of the process for mechanical removal of the insulation 3 of the flat cable 1. The flat cable 1 is firmly held by means of a holding device 7, for example by means of a vacuum table 7, over the entire cable width. An insulation removing device 8, for example a rotating milling tool 8, removes the insulation 3 at the upper side 5 of the flat cable 1 as far as the conductors 2. FIG. 5 shows the insulation 3 of the flat cable 1 in the region of a conductor 2 exposed to the depth T. FIG. 6 shows a cable portion after the exposure of the conductors 2 of the entire cable width, wherein the minimum width B of the insulation removal is predetermined by the width of the milling tool 8.

Figure 7:
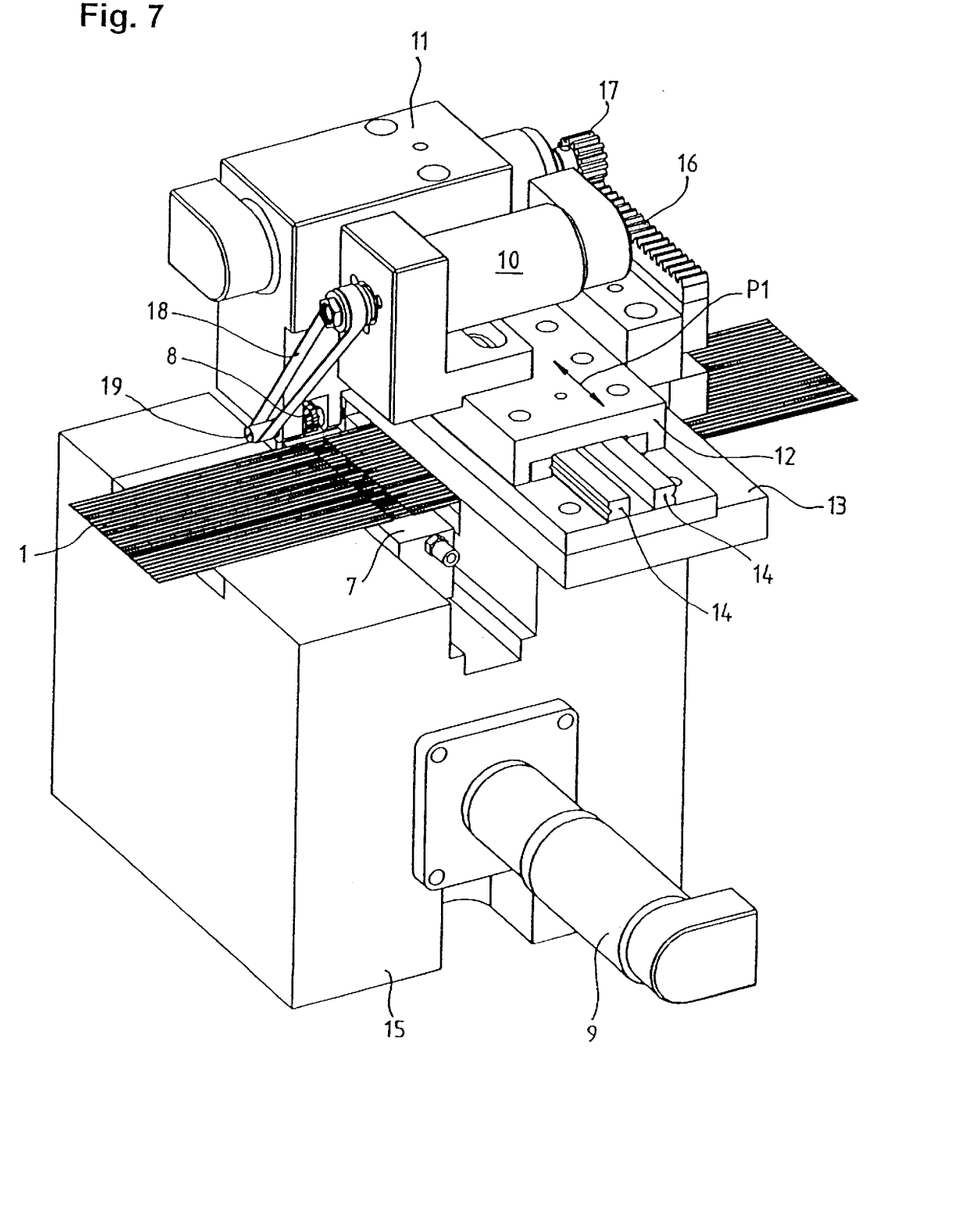
FIG. 7 shows an insulation removal device pursuant to the present invention for exposure of the conductors of the flat cable.
Figure 8:
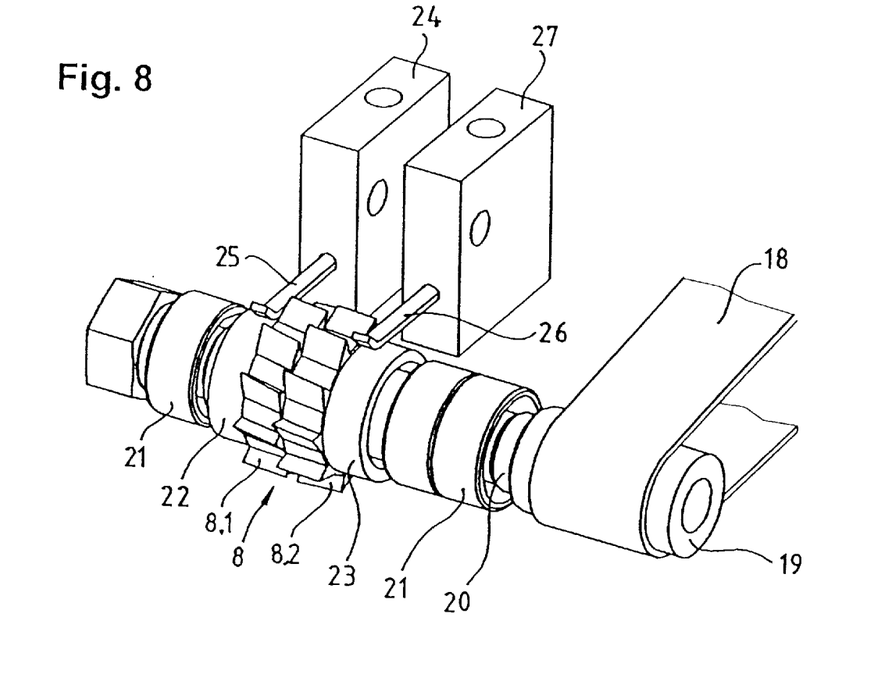
FIGS. 8 to 14 show a milling tool for exposure of the conductors and a device for monitoring the insulation removal process.

FIG. 7 shows insulation removal equipment for exposure of the conductors 2 at the upper side of the flat cable 1 by means of the insulation removal device 8 shown in FIG. 4. The equipment substantially consists of the vacuum table 7 shown in FIG. 4, a table drive 9, a milling tool drive 10 and an advancing drive 11, which is arranged on a carriage 12 and moves the milling tool drive 10 together with the milling tool 8 on the carriage 12 in the direction symbolized by an arrow P1. A suction device, which is arranged at the milling tool 8, is not illustrated. The carriage 12 is guided by means of guide rails 14 arranged at a housing table 13. The housing table 13 is supported by a housing 15, at which also the table drive 9 is arranged. The advancing drive 11, which for example consists of a motor and a transmission, moves by means of a pinion 17 along a rack 16 arranged at the housing 15 and executes the movement of the carriage 12 symbolized by the arrow P1. The milling tool drive 10 drives, for example by means of a belt 18, a pulley 19 connected with the milling tool 8.

For removal of the insulation at the underside of the flat cable 1 there is provided an advancing drive and milling tool drive, with a milling tool, arranged under the flat cable 1, wherein a vacuum table adjustable in height and arranged above the flat cable 1 is provided. The insulation removal device for the insulation removal at the lower side of the flat cable functions the same as the insulation removal device for the insulation removal at the upper side 5 of the flat cable 1.

FIGS. 8 to 14 show the milling tool 8 for exposing the conductors 2 and a device for monitoring the insulation removal process. The milling tool consists of a first milling tool half 8.1 and a second milling tool half 8.2, wherein the milling tool halves 8.1, 8.2 are carried by a first shaft 20. The shaft 20 is mounted at first bearings 21, wherein the pulley 19 driven by the belt 18 is arranged at one shaft end. The milling tool halves 8.1, 8.2 are electrically insulated relative to each other, wherein the first milling tool half 8.1 is electrically connected with a first wiper ring 22 and the second milling tool half 8.2 is electrically connected with a second wiper ring 23.

Figure 9:
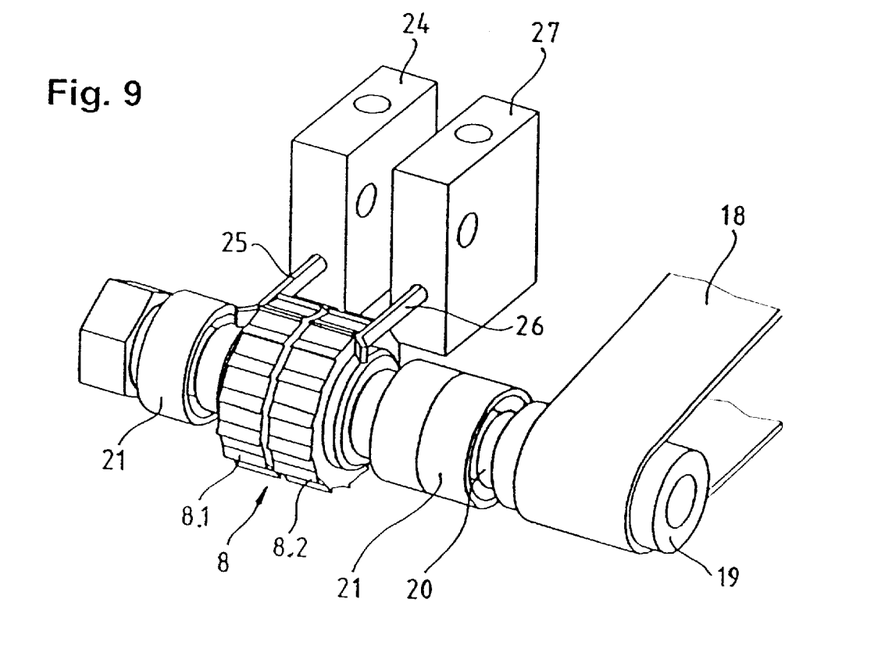
Figure 10:
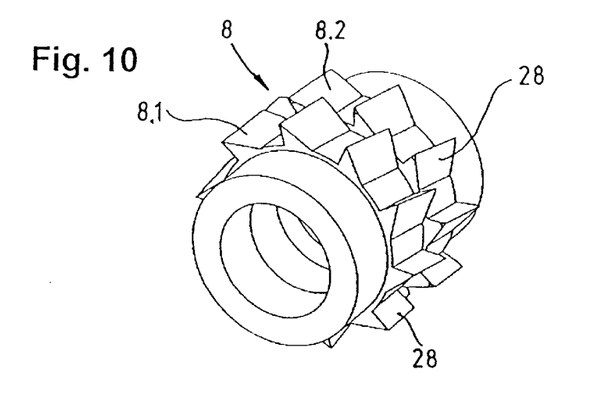
Figure 11:
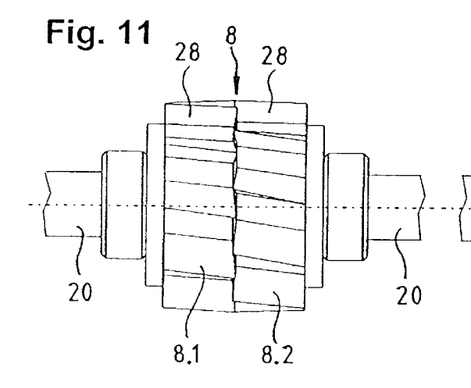
Figure 12:
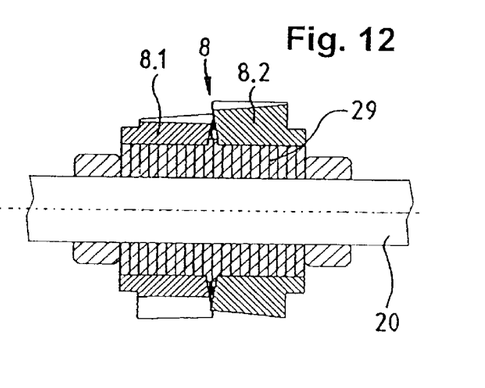
Figure 13:
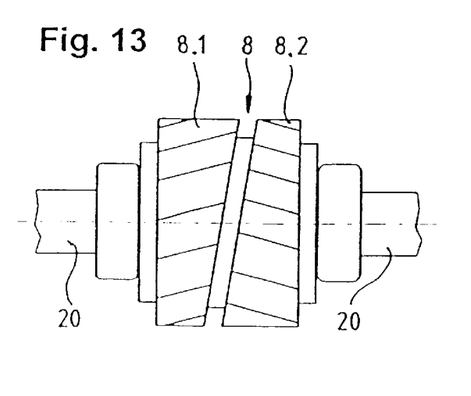
Figure 14:
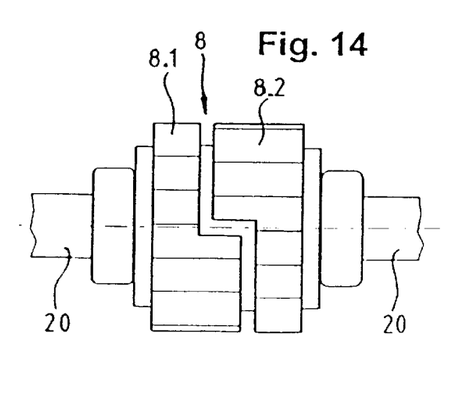

The wiper rings 22, 23 are electrically insulated relative to the shaft 20. A transmitter 24 supplies an electrical signal by means of a first wiper contact 25 to the first wiper ring 22. If both milling tool halves 8.1, 8.2 have contact with the electrical conductor 2 to be exposed, the signal from the first milling tool half 8.1 is conducted by way of the conductor 2 to the second milling tool half 8.2 and from this to the second wiper ring 23. From the second wiper ring 23 the signal passes by means of a second wiper contact 26 to a receiver 27. Due to the signal detected at the receiver, the vacuum table 7 is, at least, not raised any more. FIG. 9 shows a variant without wiper rings, wherein the first wiper contact 25 is directly connected with the first milling tool half 8.1 and the second wiper contact 26 is directly connected with the second milling tool half 8.2. FIGS. 10 to 12 show details of the milling tool 8 and the insulated arrangement thereof at the shaft 20. The milling tool halves 8.1, 8.2 comprise teeth 28 which at the adjacent sides of the milling tool halves are overlapping without contacting one another. It is ensured by the overlapping teeth 28 that during the milling of the insulation 3 no insulation burr arises between the milling tool halves 8.1, 8.2. FIG. 12 shows a section through the milling tool halves 8.1, 8.2, which are arranged at an insulating member 29 carried by the shaft 20. FIG. 13 and FIG. 14 show other embodiments of the milling tool halves 8.1, 8.2 without overlapping teeth, wherein the milling tool halves 8.1, 8.2 are so shaped that no insulation burr can arise during the milling.

Figure 15:
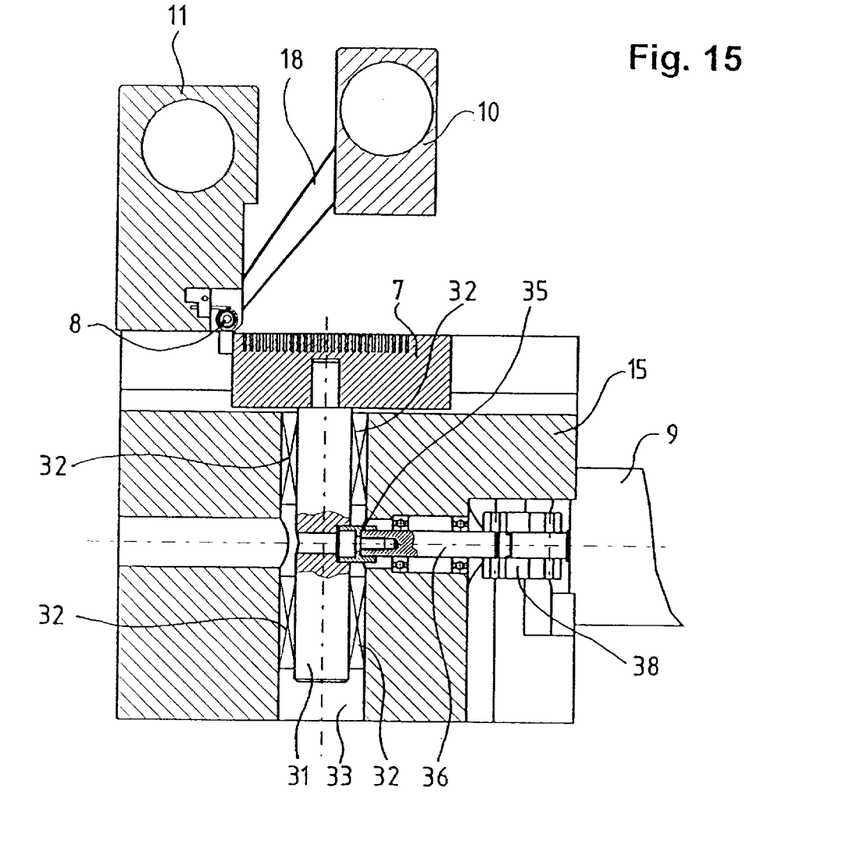
FIGS. 15 and 16 show a vacuum unit, which is adjustable in height, for holding the flat cable during exposure of the conductors.
Figure 16:
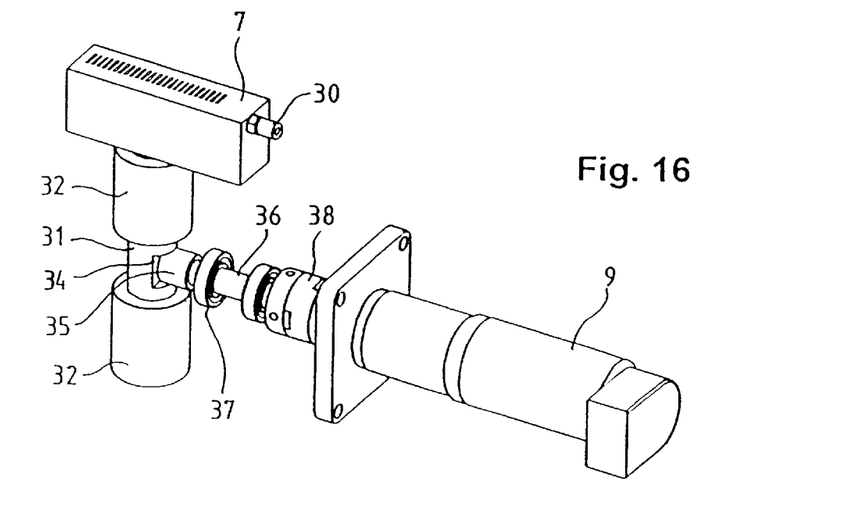

FIG. 15 and FIG. 16 show the height-adjustable vacuum table 7 for holding the flat cable 1 during baring of the conductors 2. The vacuum table 7, with a vacuum connection 30, comprises a ram 31 with third bearings 32, which are guided in a bore 33 of the housing 15. Provided at the ram 31 is a recess 34 in which an eccentric pin 35 of a second shaft 36 engages. The second shaft 36 mounted at second bearings 37 is connected by means of a clutch 38 with the table drive 9. On rotation of the second shaft 36 the eccentric pin 35 arranged eccentrically relative to the shaft axis moves the ram 31 and thus the vacuum table 7 up and down, wherein the movement takes place in very small ranges. The height adjustment is carried out in dependence on the position of the advancing drive 11 and on the signal occurring at the receiver 27. Instead of the vacuum table 7, the milling tool 8 can be adjustable in height.

Figure 17:
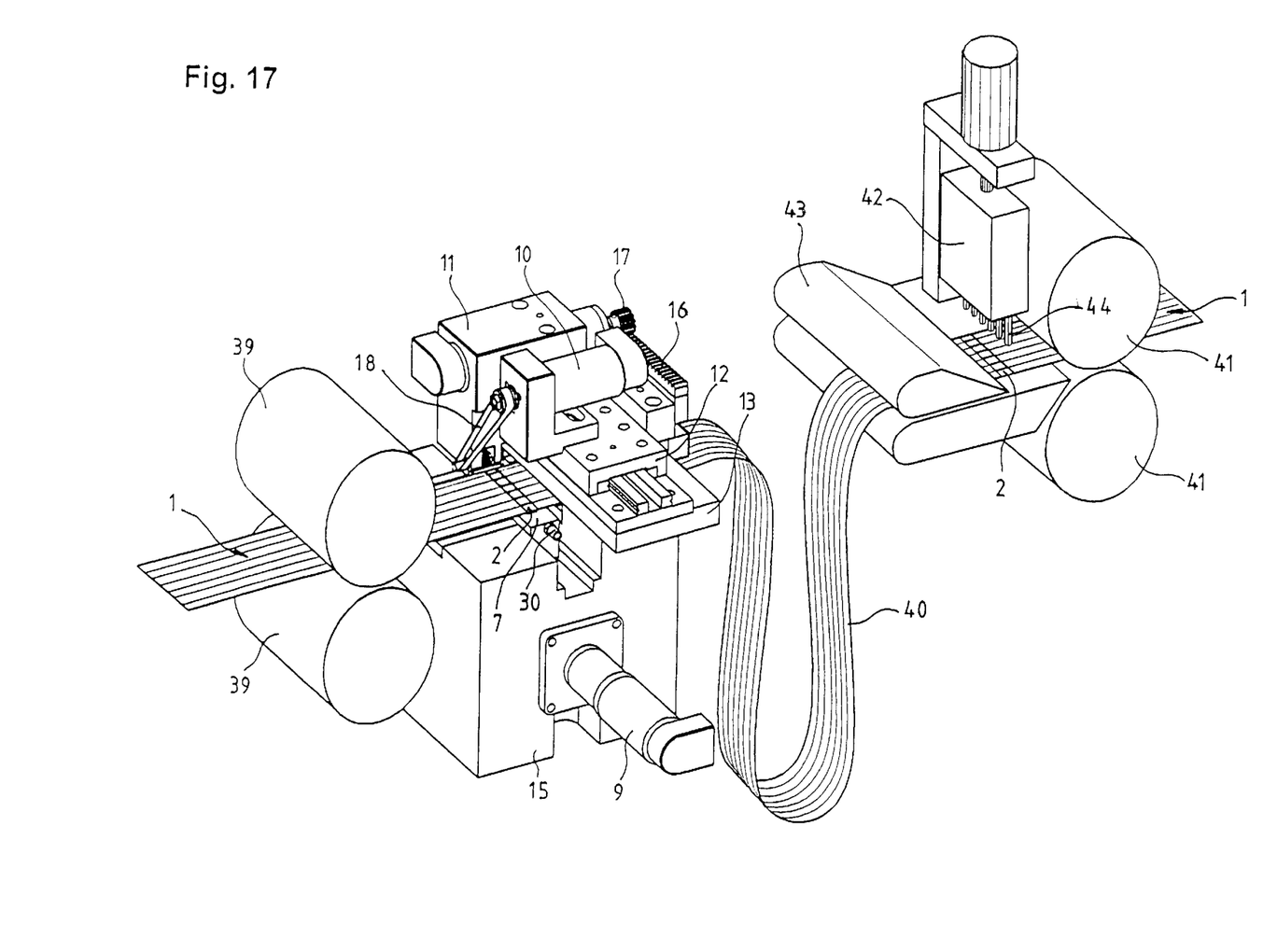
FIG. 17 shows a device for checking the stripped conductors.

FIG. 17 shows a device for checking the stripped conductors 2. The flat cable 1 is transported by means of a first cable feeder 39 and, as explained above, stripped of insulation. Thereafter the flat cable 1 is advanced by a specific amount and stripped of insulation again. At the exit of the insulation removal device the flat cable 1 forms a loop 40, which is drawn off by a second cable feeder 41. The flat cable 1 is drawn off until the exposed conductors 2 are disposed under a checking unit 42. The flat cable 1 is then fixed by means of a guide device 43 and one resilient checking contact 44 per conductor 2 is lowered onto each conductor 2 stripped of insulation. It is checked by the checking unit 42 whether conductors 2 are short-circuited relative to one another and/or whether conductors 2 are interrupted.

In a further embodiment the insulation removal process of the milling tool 8 can also be monitored by the checking unit 42. In this case an integral milling tool 8 can be used, to which the transmitter 24 supplies its signal. The vacuum table 7 is controlled on the basis of the signal detected by the checking unit 42. It can also be ascertained with this embodiment whether conductors 2 are interrupted.

Figure 18:
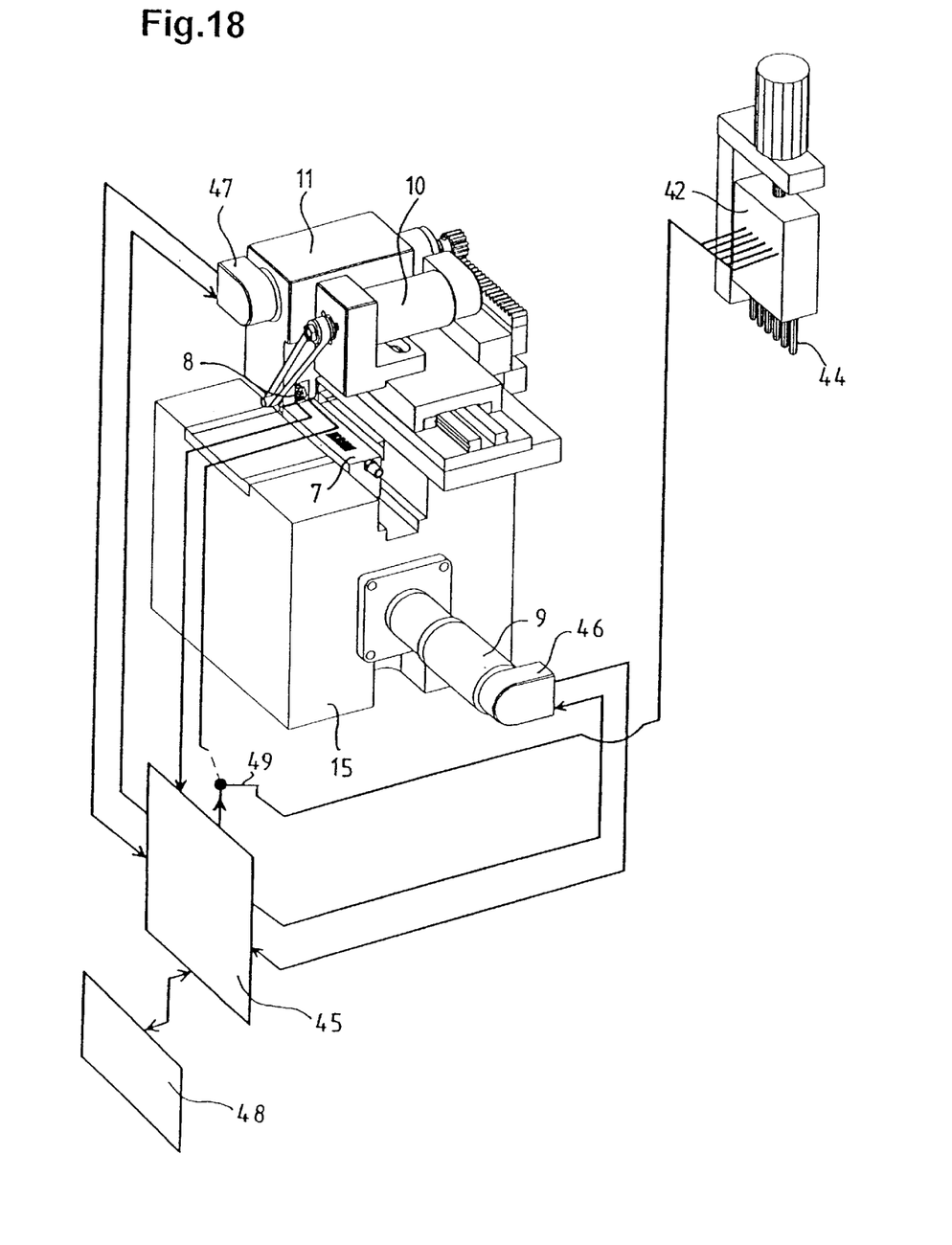
FIG. 18 shows a schematic illustration of the hardware control part of the insulation removal device.

FIG. 18 shows a schematic illustration of the hardware part of the insulation removal equipment. An interface 45 detects the signals of the checking contacts 44, the milling tool 8, a sensor 46, which is arranged at the table drive 9, for detecting the rotational position of the table drive 9, and a sensor 47, which is arranged at the advancing drive 11, for detecting the rotational position of the advancing drive 11. The data are passed on to a control 48 with a computer, which generates control data for the table drive 9 and the advancing drive 11 on the basis of the data and a program. With the control data, the interface 45 generates control signals for the table drive 9 and the advancing drive 11. As explained in the foregoing section, the insulation removal process of the milling tool 8 can also be monitored by the checking unit 42. In this case, the checking signal is conducted to the checking contacts 44 by means of the symbolically illustrated switch 49. As soon as the milling tool 8 reaches a conductor 2, the current circuit is closed. The control 48 then generates, as shown in FIG. 20, the appropriate control data for the table drive 9 and the advancing drive 11.

Figures 19, 20:
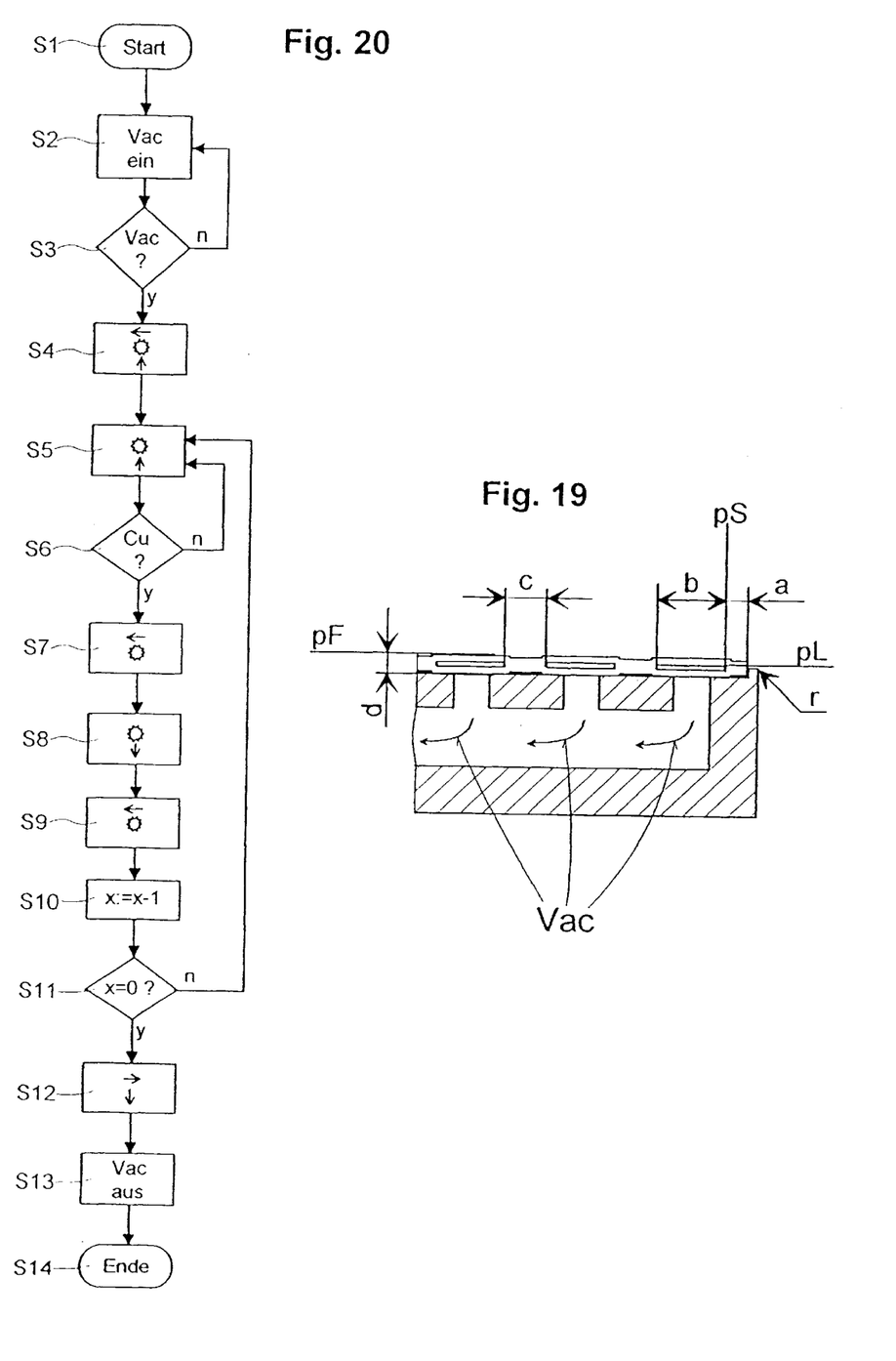
FIG. 19 shows the parameters for control of the insulation removal process.
FIG. 20 shows a flow chart for control of the insulation removal process.

FIG. 19 shows the parameters for control of the insulation removal process. The upper outer edge of the vacuum table 7 is provided as a reference point r for the control 48. The edge region of the flat cable 1 is a. The start position of the milling tool 8 is designated by ps. The width of the conductor 2 is b and the spacing between two conductors 2 is c. The thickness of the flat cable 1 is d. The cable position is pF and the conductor position is pL, wherein, viewed from the vacuum table 7, pF−pL=T.

FIG. 20 shows the sequence of the insulation removal process. The insulation removal process is started by the step S1 and the vacuum Vac of the vacuum table 7 is built up in the step S2. In the step S3 it is checked whether the necessary vacuum Vac is present. The vacuum Vac is constantly checked during the course of the insulation removal process. In the case of abnormal vacuum Vac the insulation removal device is stopped and a fault report is generated. Abnormal vacuum Vac can arise if, for example, the milling tool 8 damages or entrains the flat cable 1 or lifts off the vacuum table 7. In the step S4 the milling tool 8 is brought into the starting position ps and the vacuum table 7 raised. The movement of the milling tool 8 from an initial position into the starting position ps is symbolized by an upwardly disposed arrow directed to the left and the rotational movement of the milling tool 8 is symbolized by a centrally arranged circle. The vacuum table 7 is raised until the upper side 5 of the flat cable 1 is flush with the cable position pF. The movement of the vacuum table 7 is symbolized by a downwardly disposed arrow directed up. The symbolized representation of the movement directions and the rotational movement applies analogously to the following steps. In the steps S5 and S6 the vacuum table 7 is raised further until, as explained further above, the material Cu of the conductor 2 can be detected by the milling tool 8. In the step S7 the rotating milling tool 8 is moved to the left by the width b of the conductor 2 by means of the advancing drive 11, whereby the conductor 2 is exposed. In the step S8 the vacuum table 7 is lowered by pF−pL. The rotating milling tool 8 is then moved to the left in the step S9 by the spacing c between two conductors 2 by means of the advancing drive 11. In the step S10 the number x of conductors still to be exposed is reduced by one unit and in the step S11 it is checked whether conductors 2 still to be exposed are present. If conductors 2 are still to be exposed, the insulation removal process is continued by the step S5. After all conductors 2 are exposed, the vacuum table 7 is lowered into the initial position and the milling tool 8 brought into the starting position ps by means of the advancing drive 11 in the step S12. The vacuum Vac of the vacuum table is switched off in the step S13 and the insulation removal process ended by the step S14.

Thus, while there have been shown and described and pointed out fundamental novel features of the present invention as applied to a preferred embodiment thereof, it will be understood that various omissions and substitutions and changes in the form and details of the devices illustrated, and in their operation, may be made by those skilled in the art without departing from the spirit of the present invention. For example, it is expressly intended that all combinations of those elements and/or method steps which perform substantially the same function in substantially the same way to achieve the same results are within the scope of the invention. Substitutions of elements from one described embodiment to another are also fully intended and contemplated. It is also to be understood that the drawings are not necessarily drawn to scale but that they are merely conceptual in nature. It is the intention, therefore, to be limited only as indicated by the scope of the claims appended hereto.

We claim:

1. Equipment for removing insulation from a flat cable with conductors embedded in the insulation and extending parallelly in a longitudinal direction, comprising: means for removing the insulation transversely to the longitudinal direction down to the conductors; and a device for detection of a conductor freed from the insulation, the insulation removal means being operative to remove the insulation until the detection device detects that the conductor is freed from the insulation and is exposed.

2. Equipment according to claim 1, wherein the insulation removal means includes an insulation removal device, and further comprising a signal source operative to produce a signal which can be conducted by way of the insulation removal device and from the insulation removal device by way of the exposed conductor, and a receiver device which detects the signal.

3. Equipment according to claim 2, wherein the insulation removal device has two electrically insulated halves arranged so that the signal can be conducted to one of the halves, from the one half to the exposed conductor, from the exposed conductor to another of the halves and from the another half to the receiver.

4. Equipment according to claim 2, and further comprising a checking unit operatively arranged to monitor insulation removal, the insulation removal device being electrically insulated so that the signal can be conducted from the insulation removal device to the exposed conductor, from the exposed conductor to a previously exposed conductor and from the previously exposed conductor to the checking unit.

5. Equipment according to claim 1, and further comprising a height adjustable device operatively arranged so as to control the removal of insulation from the conductor.

6. Equipment according to claim 5, wherein the height adjustable device is a vacuum table for holding and adjusting the height of the flat cable relative to the insulation removal means.

\* \* \* \* \*